(12) United States Patent
Passamani

(10) Patent No.: US 12,040,816 B2
(45) Date of Patent: Jul. 16, 2024

(54) DIGITAL-TO-ANALOG CONVERTER WITH STATIC ALTERNATING FILL ORDER SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 175 days.

(21) Appl. No.: 17/843,523

(22) Filed: Jun. 17, 2022

(65) Prior Publication Data

US 2023/0412189 A1 Dec. 21, 2023

(51) Int. Cl.
*H03M 1/76* (2006.01)
*H03M 1/66* (2006.01)
*H03M 1/68* (2006.01)
*H03M 1/74* (2006.01)

(52) U.S. Cl.
CPC ............ *H03M 1/765* (2013.01); *H03M 1/661* (2013.01); *H03M 1/66* (2013.01); *H03M 1/685* (2013.01); *H03M 1/74* (2013.01)

(58) Field of Classification Search
CPC ...... H03M 1/765; H03M 1/661; H03M 1/685; H03M 1/66; H03M 1/74
See application file for complete search history.

(56) References Cited

U.S. PATENT DOCUMENTS

| 4,124,845 | A | 11/1978 | Huntsinger et al. |
| 5,684,482 | A | 11/1997 | Galton |
| 8,928,512 | B2 | 1/2015 | Yuan et al. |
| 2023/0079487 | A1* | 3/2023 | Zhao ...................... H03M 1/74 375/219 |

* cited by examiner

*Primary Examiner* — Joseph J Lauture
(74) *Attorney, Agent, or Firm* — Fletcher Yoder P.C.

(57) ABSTRACT

A number of unit cells of a digital-to-analog converter (DAC) may be simultaneously activated to generate an analog signal according to a decoded digital signal. However, while many unit cells may be generally the same, there may be variations in the gains associated with each unit cell (e.g., based on the locations of the activated unit cells within a unit cell array) amounting to a gain gradient that may cause error in the analog output. As such, a fill order may be set or selected to counter such variation by activating a particular arrangement of unit cells, as opposed to simply the number of unit cells, for a given digital signal. By filling the unit cell array from different sides, spatially and/or temporally, the gain gradient associated with the unit cells may be balanced to reduce error and increase the linearity of the DAC.

20 Claims, 16 Drawing Sheets

DIGITAL-TO-ANALOG CONVERTER WITH STATIC ALTERNATING FILL ORDER SYSTEMS AND METHODS

BACKGROUND

This disclosure generally relates to digital-to-analog converters (DACs) and order of enablement of unit cells of the DACs.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. In some scenarios, the physical and/or logical layout of unit cells within a DAC may alter the data path length to each unit cell and/or the number of circuitry components traversed by the digital signal, which may affect the speed of operation of the DAC and/or the linearity of the DAC. Furthermore, the unit cells that are selected to be activated for a given digital signal may further affect the linearity and/or noise of the DAC output.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a digital-to-analog converter (DAC) may include a unit cell array having multiple unit cells, a branching data path coupled to the unit cells, and dynamic alternating fill order (AFO) logic disposed on the branching data path. The dynamic AFO logic may include one or more AND gates, one or more OR gates, and state selection circuitry that selectively directs a first output of the dynamic AFO logic to either a first branch of the branching data path or a second branch of the branching data path.

In another embodiment, an electronic device may include a DAC having multiple cells, a data path configured to communicate a digital signal to the cells, and dynamic AFO logic that selectively outputs a first portion of the digital signal and a second portion of the digital signal to respective branches of a plurality of different branches of the data path according to a dynamic AFO program. The first portion of the digital signal and the second portion of the digital signal may include, at least partially, decoded portions of the digital signal. Additionally, the electronic device may include an AFO controller configured to generate the dynamic AFO program.

In yet another embodiment, a method may include receiving, at a DAC, a first digital signal corresponding to a first analog output of the DAC. The DAC may include multiple cells disposed in a unit cell array to generate the first analog output. The method may also include generating, via dynamic AFO logic, partially decoded portions of the first digital signal, based on the first digital signal, and directing the partially decoded portions of the first digital signal along different data paths to the cells such that a fill order of the cells starts at a first location in the unit cell array. The method may also include receiving, at the DAC, a second digital signal corresponding to a second analog output and generating, via the dynamic AFO logic, partially decoded portions of the second digital signal based on the second digital signal. The method may also include directing, via the dynamic AFO logic, the partially decoded portions of the second digital signal along the different data paths to cells such that the fill order of the cells starts at a second location in the unit cell array, different from the first location.

In yet another embodiment, a DAC may include a unit cell array having multiple unit cells, a branching data path coupled to the unit cells, and static AFO logic disposed at a branch point on the branching data path. The static AFO logic may include multiple buffers that receive a digital signal and output a first portion of the digital signal onto a first branch of the branching data path and a second portion of the digital signal onto a second branch of the branching data path. Additionally, the first portion of the digital signal and the second portion of the digital signal may have a reduced bit depth relative to the digital signal.

In yet another embodiment, an electronic device may include a DAC having multiple cells disposed in a unit cell array. The DAC may also include a data path to communicate a digital signal, corresponding to an analog output of the DAC, to the cells and static AFO logic that sets a fill order of the unit cell array that alternates unit cell activations for sequentially increasing values of the digital signal between opposing sides of the unit cell array relative to at least one axis of the unit cell array. The electronic device may also include a load that receives the analog output of the DAC.

In yet another embodiment, a method may include receiving, at a DAC, a digital signal corresponding to an analog output signal of the DAC. The DAC may generate the analog output signal and include multiple cells disposed in a unit cell array. The method may also include generating, via static AFO logic, a first partially decoded portion of the digital signal and a second partially decoded portion of the digital signal based at least in part on the digital signal. The method may also include directing, via the static AFO logic, the first partially decoded portion of the digital signal along a first data path to a first set of cells and the second partially decoded portion of the digital signal along a second data path to a second set of cells such that a fill order of the unit cell array alternates between the first set of cells and the second set of cells.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
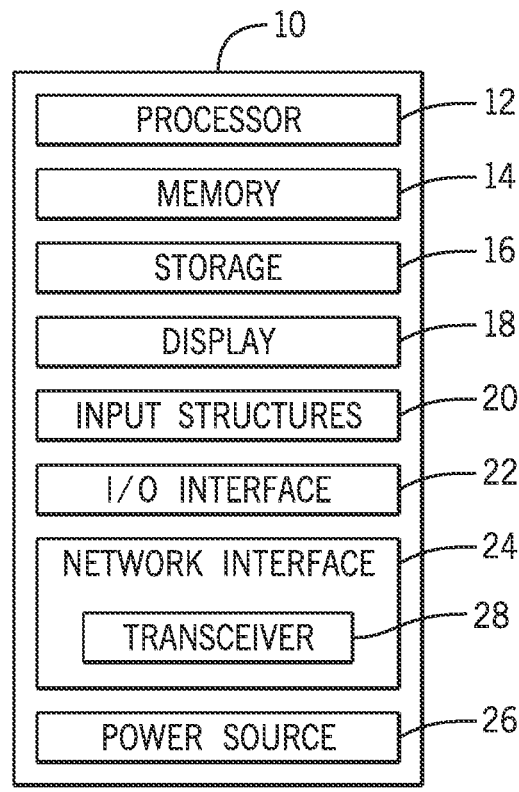
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

An electronic device may use one or more digital-to-analog converters (DACs) to convert digitally coded data (e.g., coded via binary code, grey-code, thermometer code, etc.) to a corresponding analog output voltage. For example, the electronic device may transmit and receive radio frequency (RF) signals to communicate with other electronic devices. In general, DACs may generate an analog electrical signal to be transmitted by switching on one or more unit cells to output one or more unit level currents or voltages that, in the aggregate, forms the analog electrical signal. In some scenarios, the physical and/or logical layout of the unit cells may alter the data path length to each unit cell and/or the number of circuitry components traversed by the digital signal, which may affect speed of operation of the DAC and/or linearity of the DAC. For example, a column and line DAC may use parallel control circuitry to decipher, reprocess, and/or combine digital data to control operation of unit cells to generate an analog signal. However, the logical layout of the column and line control circuitry, as well as the physical layout of the column and line unit cells, may create varying data path lengths to the unit cells, as well as more complicated and/or slower control logic operation, than that of a fractal DAC. This may lead to phase delays and/or synchronicity issues when compared to the fractal DAC.

In some embodiments, a fractal arrangement of unit cells and/or the transmission lines thereto in branches (e.g., as may be implemented in the fractal DAC) may assist in homogenizing the data path length to each of the unit cells, which may result in increased speed (e.g., operating frequency) of the DAC, increased linearity, better synchronous performance, and/or potential power savings. For example, as opposed to column and line DACs, where the data path to different unit cells may vary, a fractal DAC may have a static (e.g., same or similar) path length for the incoming data to each of the unit cells. In other words, each branch of the fractal layout tree may have equal length from the input to the unit cells. As such, there is reduced or minimized waiting between moments when activation signals arrive at different unit cells to be activated for a given data value. Additionally, simplified distribution (e.g., via sequential decision units) of the incoming data to the unit cells may be further or alternatively simplified by reducing gate cells and/or reprocessing or recombining the data signals, which may further increase speed capabilities (e.g., operating frequency) and/or linearity (e.g., decreased differential nonlinearity (DNL) and/or integral nonlinearity (INL)) of the DAC. In some embodiments, the decision units may be disposed at branch points of the fractal DAC and facilitate decoding a digital signal into the thermometer coded data for the unit cells. Moreover, due to the sequential nature of the decision units governing the unit cells, some signals (e.g., a clock signal, a phase signal, etc.) may be turned off when it is known that no further unit cells may be needed in a particular branch yielding increased power savings.

During operation, a number of unit cells corresponding to the input digital signal may be activated (e.g., simultaneously or concurrently) to generate the analog signal. However, while many unit cells may include generally the same components and have generally the same dimensions (e.g., within manufacturing tolerances), there may be variation (e.g., non-linearity, noise, etc.) in the analog output based on the locations of the activated unit cells. For example, the outputs of the unit cells may be connected via an output grid, and the output grid may include a tap point to the load, which may include an impedance matching network. The output grid may aggregate the signals from the unit cells and provide the analog output signal at the tap point. However, unit cells closer to the tap point may contribute different (e.g., higher) gains (e.g., via phase differences and/or voltage differences) than unit cells further from the tap point leading to a gradient in the gains of the unit cells. As such, the physical order in which unit cells are to be activated (e.g., the fill order) for a given digital signal may be set or selected to counter such variation. In other words, as additional unit cells are activated for increased values of the analog output signal, the fill order in which the unit cells are activated may be set or selected to increase the linearity and/or decrease the noise of the DAC. Moreover, the fill order may be set or selected to account for manufacturing variations, gradients in the supply voltage, output line routing, and/or environmental factors such as temperature.

In some embodiments, a static fill order may be implemented via one or more alternating fill order (AFO) decision units located along the data path of the fractal DAC. Static folding of the noise associated with the gain gradients of the unit cells may cause the differences in gain (e.g., in voltage and/or phase) to cancel each other out, at least partially, and/or spread out to provide an improved (e.g., higher) signal-to-noise ratio (SNR). For example, an AFO decision unit implemented at the first decision unit may provide for symmetric filling of the unit cells (i.e., for increasing values of the analog output signal) starting at opposite sides of the DAC. Indeed, an AFO decision unit may split the data path of the digital signal and repeat the multiple bits of the incoming digital signal to both sides of the data path (e.g., branching data path), while providing a remainder bit (e.g., the least significant bit (LSB)) to one branch of the data path and not the other. As should be appreciated, while the fill order may be symmetrical with respect to one or more axes (e.g., horizontal, vertical, and/or diagonal axes with respect to the array of unit cells), the remainder may be added to one side, and not the other, to account for uneven (e.g., odd) values.

Additionally or alternatively, in some embodiments, a dynamic fill order may be implemented by a programmable decision unit. In some embodiments, the programmable decision unit may alternate the fill order to select different branches of the fractal DAC to be activated across subsequent digital signals. For example, the DAC may utilize a first fill order for a first digital signal, and a second fill order for a subsequent digital signal. Changing the fill order in the frequency domain (e g, over time/cycles) may allow the differences in gains of the unit cells to be relocated in the frequency domain, according the fill order program. For example, the fill order program may dictate the frequency at which the polarity (e.g., direction) of the dynamic fill order is changed. Moreover, the fill order program may utilize simple changes (e.g., every other cycle, every two cycles, every third cycle, etc.) to the dynamic fill order and/or complex changes (e.g., based on noise shaping functions) to the dynamic fill order to relocate the noise associated with the gain gradients of the unit cells. By relocating the noise, frequencies of interest may have an improved (e.g., higher) SNR.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
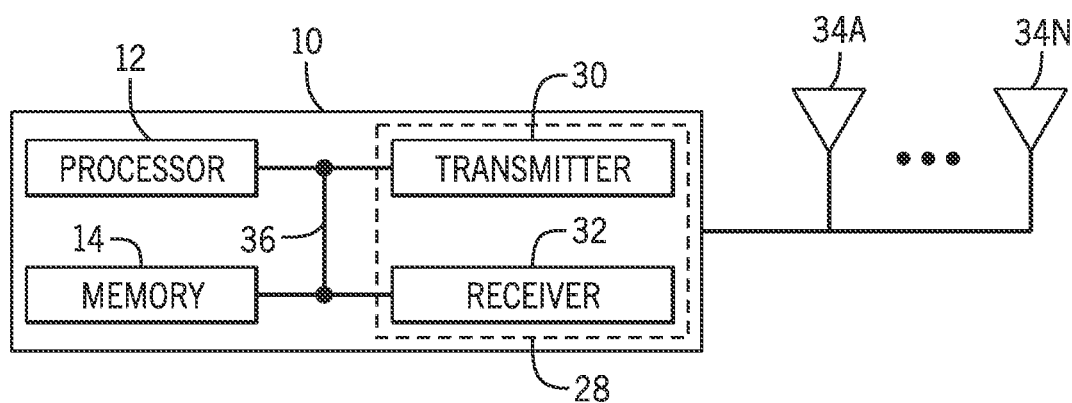
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
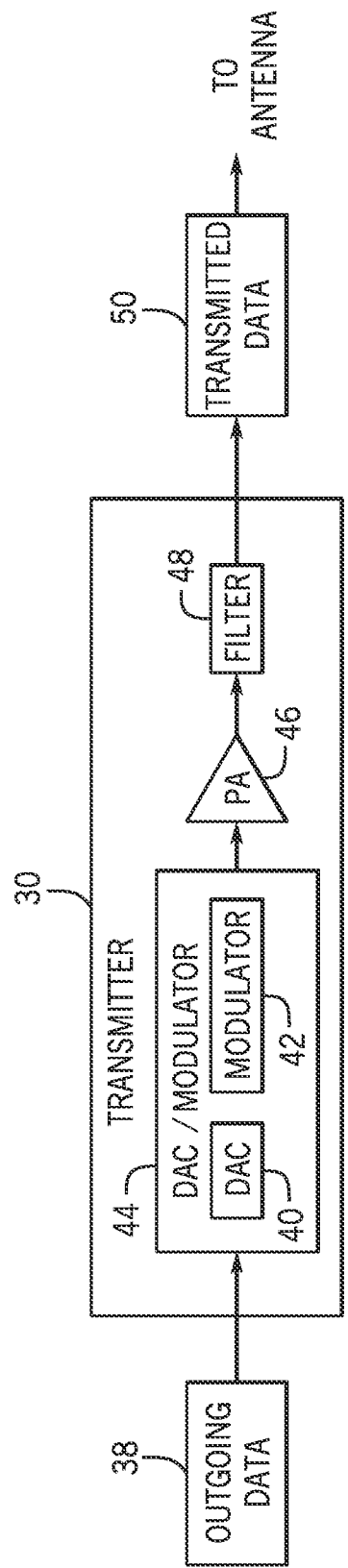
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC 40 or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
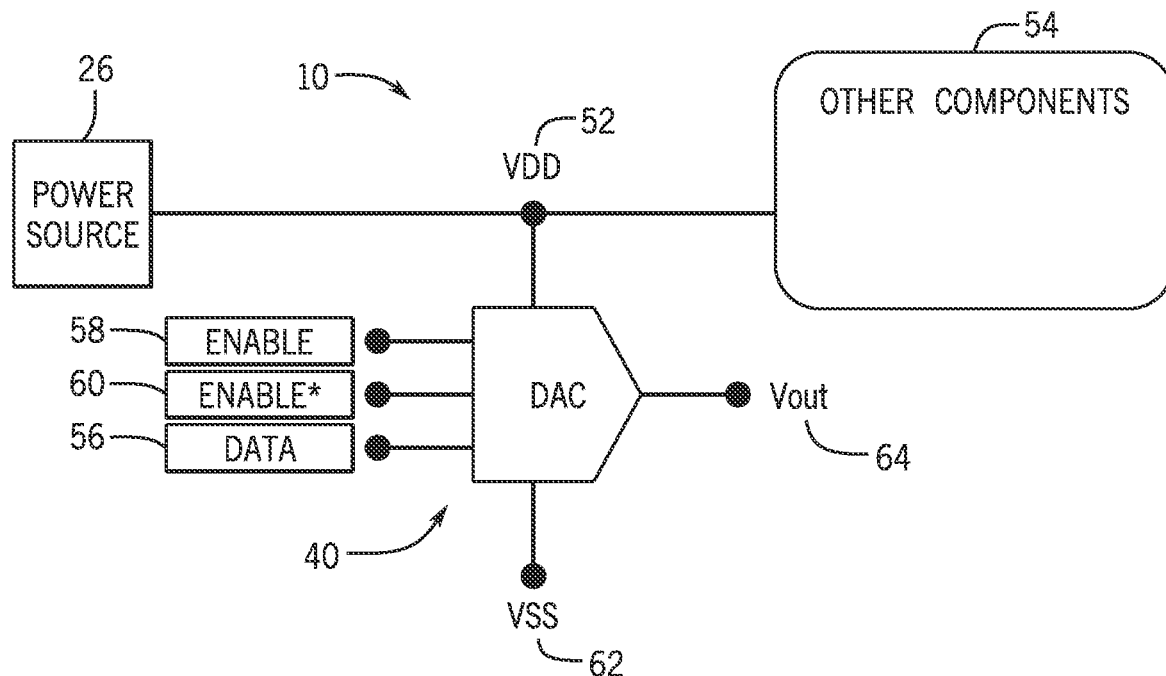
FIG. 4 is a schematic diagram of a portion of the electronic device of FIG. 1 including a digital-to-analog converter of the transmitter of FIG. 3, in accordance with an embodiment of the present disclosure.

FIG. 4 is a schematic diagram of a portion of the transmitter 30 of the electronic device 10 having a DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive a digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
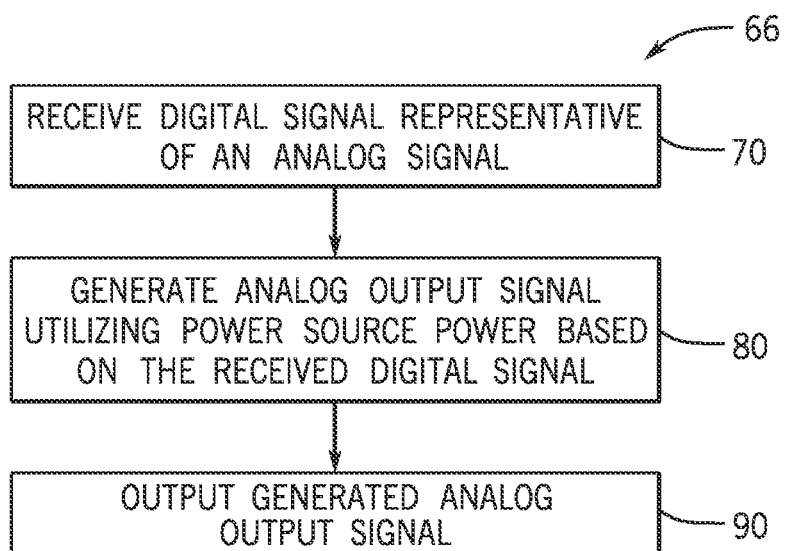
FIG. 5 is a flowchart of a method for converting a digital signal to an analog signal using the digital-to-analog converter of FIG. 4, in accordance with an embodiment of the present disclosure.

FIG. 5 is a flowchart of a method 66 for converting a digital signal to an analog signal using the DAC 40, according to an embodiment of the present disclosure. In general, the DAC 40 may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
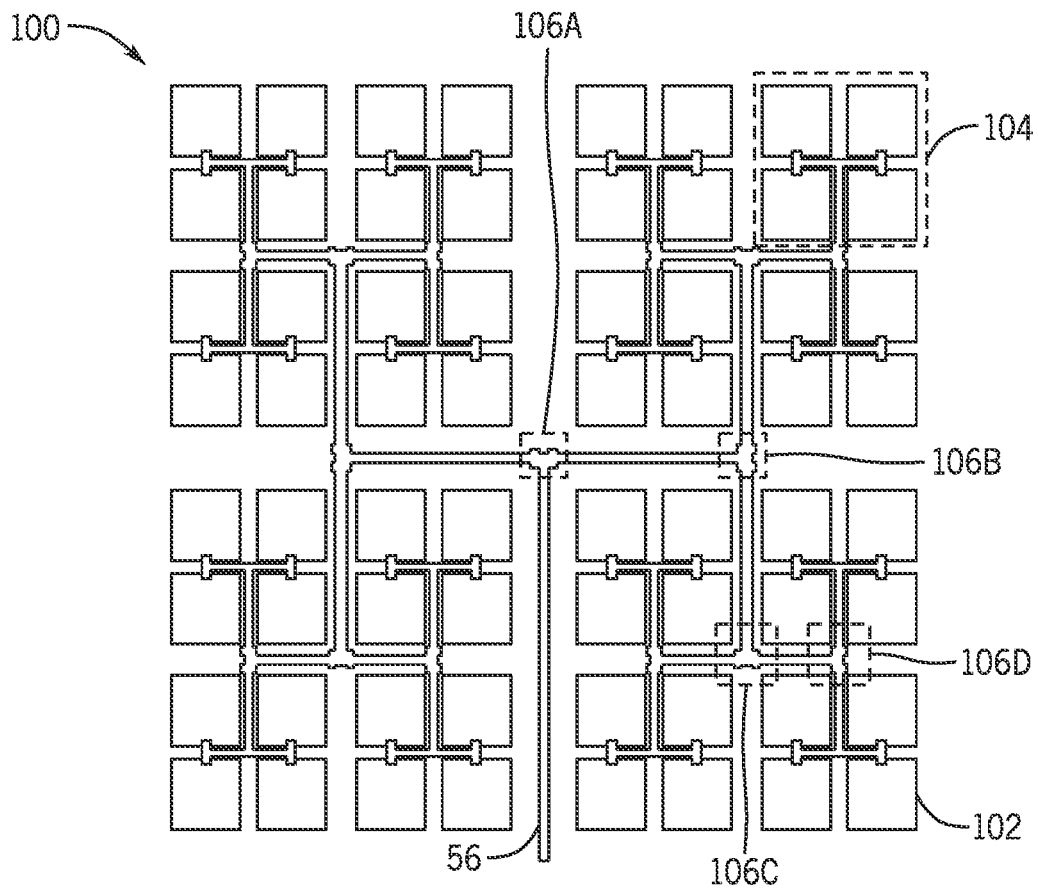
FIG. 6 is a schematic diagram of a fractal digital-to-analog converter, in accordance with an embodiment of the present disclosure.

As discussed above, the DAC 40 may generate an analog output signal 64 by enabling one or more unit cells to output a unit amount of current or voltage that, in the aggregate, form the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC 40 and/or the linearity of the DAC 40. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain $4^x$ unit cells 102 (where x is the number of fractal block recursions in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., $2^x$ number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential non-linearity (DNL) and/or integral nonlinearity (INL).

In some embodiments, the multiple nested fractal blocks 104 may be continuously/recursively split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
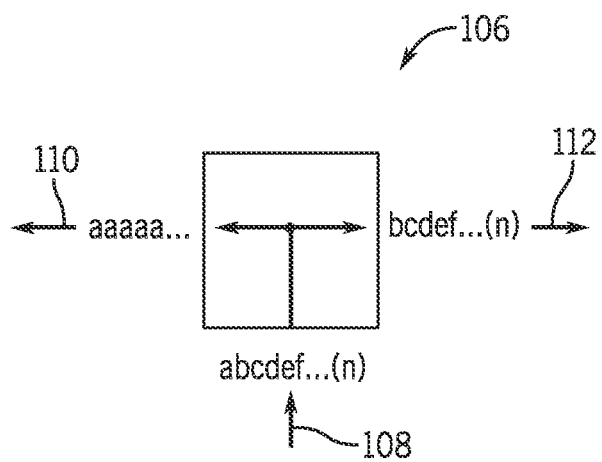
FIG. 7 is a schematic diagram of a decision unit of the fractal digital-to-analog converter of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation).

As a non-limiting example of unit cell operation, the incoming signal 108 may have n-bits (e.g., abcdef . . . n, where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits. As should be appreciated, the MSb of a binary signal is representative of half of the value of the incoming signal 108. As such, if the MSb (e.g., at decision unit 106A) is a logical "1", the repeated logical "1" may be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth. Furthermore, while depicted as outputting the MSb signal 110 to the left and the LSb signal 112 to the right, decision units 106 may output the LSb signal 112 and MSb signal 110 in either direction according to a fill order (e.g., an order increasing activations of unit cells 102) of the fractal DAC 100, which may be programmable. Moreover, in some embodiments, the digital signal 56 may include a remainder bit which may be considered independently or as part of the LSb signal 112 to facilitate decoding from a binary digital signal to a thermometric digital signal (e.g., at the unit cells 102).

Additionally, although depicted in FIGS. 6 and 7 as having two outputs (e.g., MSb signal 110 and LSb signal 112), in some embodiments, the decision units 106 may evaluate multiple bits of the incoming signal 108 at the same time (e.g., simultaneously or concurrently). For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108. As should be appreciated, the above unit cell operation is given as an example, and different methods for decoding and dispersing the digital signal 56 to the unit cells 102 may also be utilized. For example, as discussed further below, different portions of the digital signal 56 may be output on the different branches of the decision units 106 to produce a particular fill order of the unit cells 102.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of or separate from the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.25, 0.5, 0.75, or 1.0 of a unit voltage or current). For example, the binary coded unit cell 102 may include binary interpretation logic to decode the binary signal and enable the binary coded unit cell 102 at an intermediate power level (e.g., 0.25, 0.5, or 0.75 of a unit voltage or current). In some embodiments, one or more binary coded unit cells 102 may be implemented within the unit cell array and/or as additional unit cells 102 disposed alongside the unit cell array. The binary-sized output of the binary coded unit cells 102 may facilitate increasing resolution of the analog output signal 64 by providing increased granularity.

Figure 8:
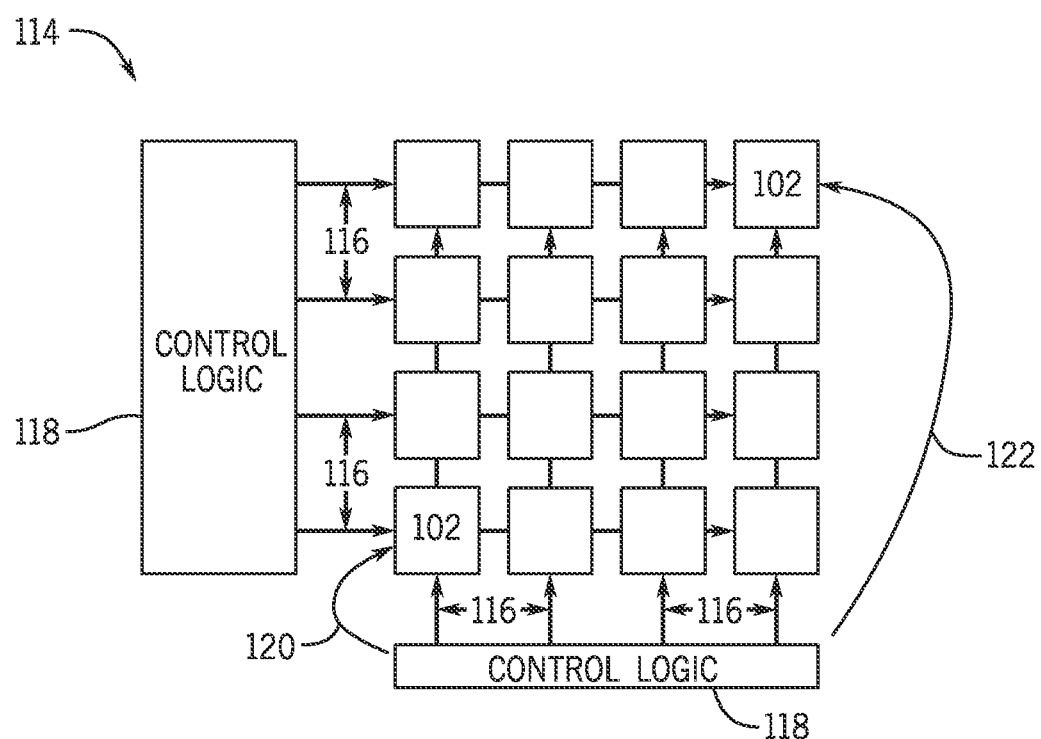
FIG. 8 is a schematic diagram of a column and line digital-to-analog converter, in accordance with an embodiment of the present disclosure.

The fractal DAC 100 may provide increased benefits (e.g., increased speed, increased linearity, decreased DNL, and/or decreased INL) over other forms of DACs such as a column and line DAC 114, as shown in FIG. 8. In some scenarios, the column and line DAC 114 may include a multitude of control signals 116 from control logic 118 feeding an array of unit cells 102. Moreover, while the control logic 118 of the column and line DAC 114 may be non-uniform and have more complex control signals 116, the fractal DAC 100, as discussed herein, may include repeated or reproduced decision units 106 with simplified outputs (e.g., the MSb signal 110 and the LSb signal 112). For example, the control logic 118 of the column and line DAC 114 may incorporate binary to thermometric conversion and/or take into consideration the desired states of multiple individual unit cells 102 concurrently or simultaneously to determine control signals 116 necessary for operation. On the other hand, the simplified decision units 106 may operate faster than control logic 118 of a column and line DAC 114 due to the simplified set of inputs and outputs. Furthermore, the linear nature of the data lines and decision units 106 of a fractal DAC 100 may result in fewer errors and/or less effect when errors, such as mistaken logical values, occur. Additionally, in some embodiments, each decision unit 106 of a fractal DAC 100 may have substantially the same components and/or dimensions, simplifying manufacturing. Moreover, one or more decision units 106 may be implemented while reducing or eliminating gate logic to further increase operating speed.

In some scenarios, the location of the decision units 106 within the array of unit cells 102 may increase the size the array. However, due at least in part to the reduced complexity of the control circuitry (e.g., the decision units 106 compared to the control logic 118), the internalization of the decision units 106 with the array of unit cells 102 may result in an overall smaller DAC 40 by reducing or eliminating control logic 118 exterior to the array of unit cells 102.

In addition to providing a simplified manufacturing process, simplified operation, decreased size, and/or increased speed of operation, the fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. As should be appreciated, in some embodiments, some data paths of a fractal DAC 100 may differ due to manufacturing tolerances, physical layout constraints, data-line-to-data-line coupling, and/or additional implementation factors and interference.

On the contrary, other DACs, such as the column and line DAC 114 depicted in FIG. 8, may have unequal paths to different unit cells 102—shorter paths (e.g., short data path 120) and longer paths (e.g., long data path 122). In some scenarios, the disparate physical lengths and/or disparate logical circuitry traversed in a column and line DAC 114 may result in the column and line DAC 114 waiting until a specified time to allow for the control signals 116 to traverse the longer paths (e.g., long data path 122). However, a fractal DAC 100 may include data paths that are substantially the same, innately providing the decoded incoming signal 108 to each of the unit cells 102 concurrently or at substantially the same time compared to other DACs (e.g., the column and line DAC 114). In other words, the substantially similar data paths of the fractal DAC 100 may reduce or eliminate a wait time associated with the difference between shorter and longer data paths (e.g., the difference between short data path 120 and long data path 122), further increasing the operable speed of the fractal DAC 100.

Figure 9:
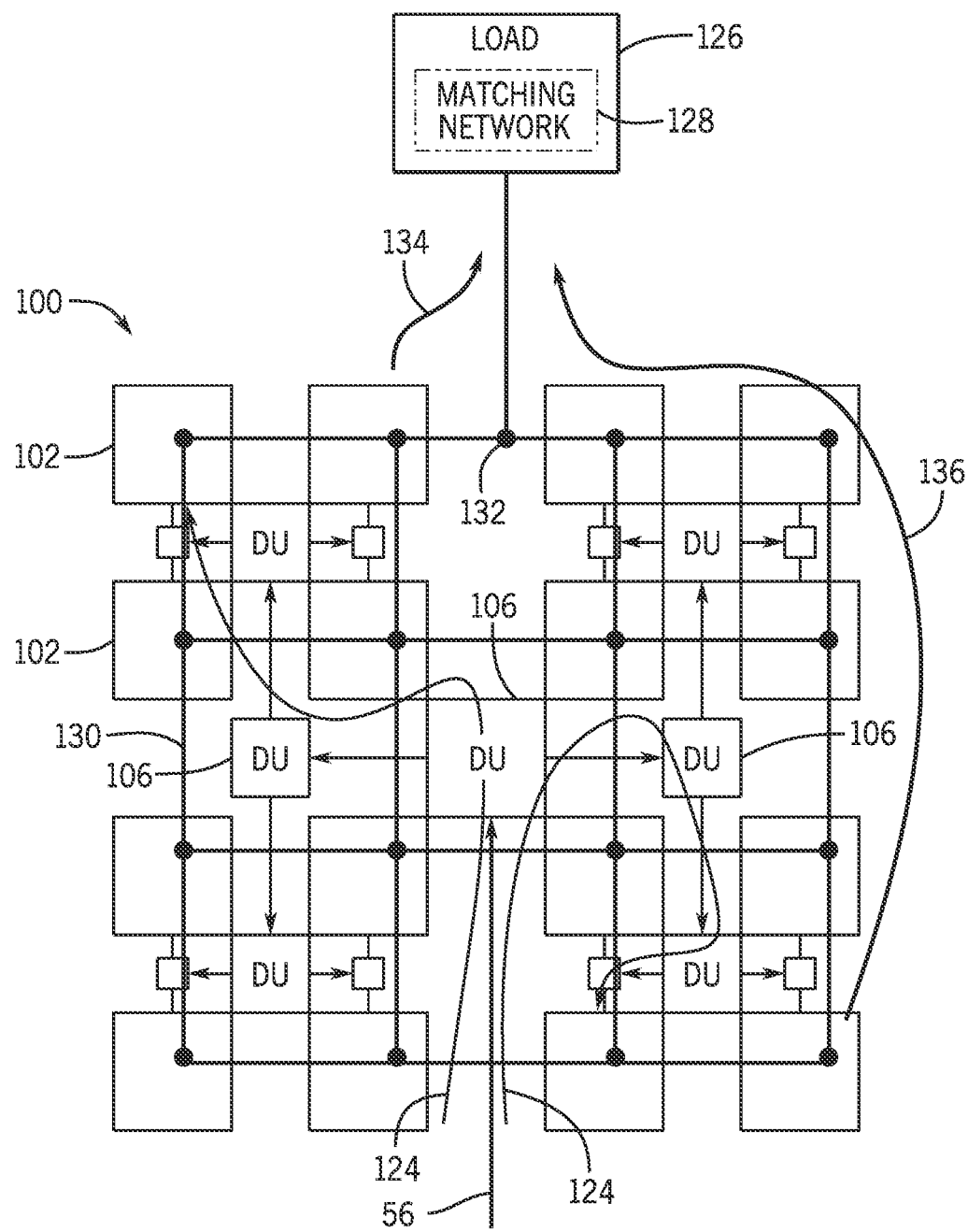
FIG. 9 is a schematic diagram of an output grid electrically connecting unit cells of the fractal digital-to-analog converter of FIG. 6 to a load, in accordance with an embodiment of the present disclosure.

As discussed above, the input data paths 124 of the digital signal 56 within the fractal DAC 100 are substantially the same length, as shown in FIG. 9. Moreover, as stated above, the output of each unit cell 102 may be aggregated to form the analog output signal 64. In some embodiments, the output paths of the unit cells 102 may follow a similar fractal patterned path (e.g., the reverse of the input data paths 124)—not shown—to provide the analog output signal 64 to a load 126. As should be appreciated, the load 126 may be any suitable client of the fractal DAC 100 such as an amplifier, antenna, etc. and may include an impedance matching network 128 to help maintain linearity and consistency of the analog output signal 64. A fractal patterned path for the output of each unit cell 102 may provide increased linearity, but may also increase the overall output path distance from the unit cells 102 to the load 126. Such increased output path distance may generate parasitic inductance and result in reduced output power. Moreover, providing each unit cell 102 with its own output path may individualize the unit cells 102 and create higher complexity (e.g., phase differences) in aggregating the outputs. As such, in some embodiments, the unit cells 102 may be connected to an output grid 130 with one or more tap points 132 connected to the load 126.

The output grid 130 may aggregate the signals from the unit cells 102 and provide the analog output signal 64 at the tap point 132. However, unit cells 102 closer to the tap point 132 (e.g., having a shorter output path 134) may have a different contribution to the analog output signal 64 than unit cells further from the tap point 132 (e.g., having a longer output path 136). For example, unit cells 102 closer to the tap point 132 may have different (e.g., higher) gains (e.g., via phase differences and/or voltage differences) than unit cells 102 further from the tap point 132, leading to a gradient in the gains of the unit cells. As such, even when activating the same number of unit cells 102, different selections of unit cells 102 may generate different analog output signals 64. To compensate, the unit cells 102 that are to be activated (e.g., according to a fill order) for a particular digital signal 56 may be set or selected to counter such variation. In other words, as additional unit cells 102 are activated for increased values of the analog output signal 64, the fill order in which the unit cells 102 are activated may be set or selected to increase the linearity and/or decrease the noise of the fractal DAC 100. Moreover, the fill order may be set or selected to account for manufacturing variations, gradients in the supply voltage, output line routing, and/or environmental factors such as temperature.

Figure 10:
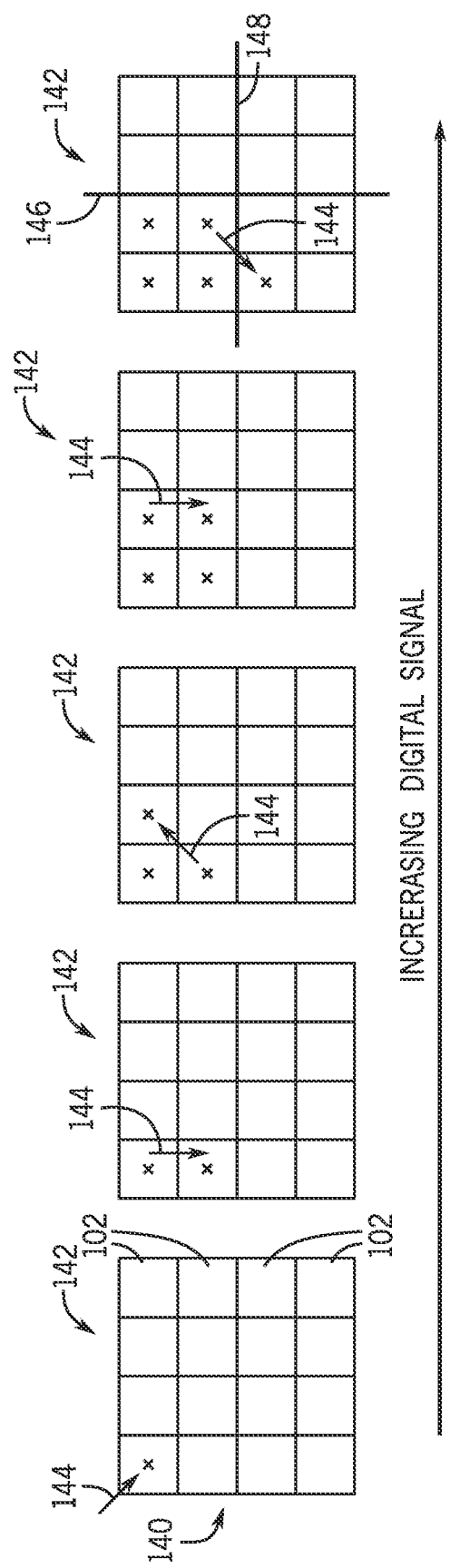
FIG. 10 is an example fill order of sequentially increasing activations of unit cells of a unit cell array, in accordance with an embodiment of the present disclosure.

To help illustrate, FIG. 10 is an example fill order 140 of sequentially increasing activations (e.g., with increasing values of the digital signal 56) of unit cells 102 of a unit cell array 142, according to an embodiment of the present disclosure. As used herein, chronological (e.g., before, after, and/or sequential) activation of the unit cells 102 may be considered over multiple cycles of digital signal 56, as the unit cells 102 may be enabled/disabled concurrently or substantially simultaneously for a given digital signal 56. In some embodiments, the fill order 140 may begin at a corner and propagate through the unit cell array 142, for example, as depicted by the fill arrows 144. In some embodiments, the fill order 140 may include crossing points at edges of subsequent fractal blocks 104 and/or progress in a snaked, spiral, zig-zag, linear, or other pattern. Furthermore, in some embodiments, the fill order 140 may attempt to sequentially activate unit cells 102 that are physically adjacent (e.g., laterally, vertically, or diagonally) to improve linearity (e.g., decreased DNL and/or INL). For example, utilizing immediately adjacent (e.g., directly above, below, to the side, or diagonal to) unit cells 102 in transitioning from a first digital signal 56 to a second digital signal 56 may decrease an impact of process-gradients affecting the individual unit cells 102, which may lead to decreased DNL. However, a static fill order 140 progressing from a single side may not provide symmetry about a vertical axis 146 and/or a horizontal axis 148 and, thus, may not balance the gain gradients, depending on the tap point 132. As should be appreciated, the fill order 140 illustrated in FIG. 10 is given as an example, and other fill orders 140 may also be used that enable adjacent unit cells 102. For example, the fill order 140 may begin at a center of the unit cell array 142 and propagate through the unit cell array 142 filling one quadrant (e.g., block) at a time. Moreover, the depicted fill order 140 may be reversed or otherwise altered while still maintaining the adjacency property of added unit cells 102.

Figure 11:
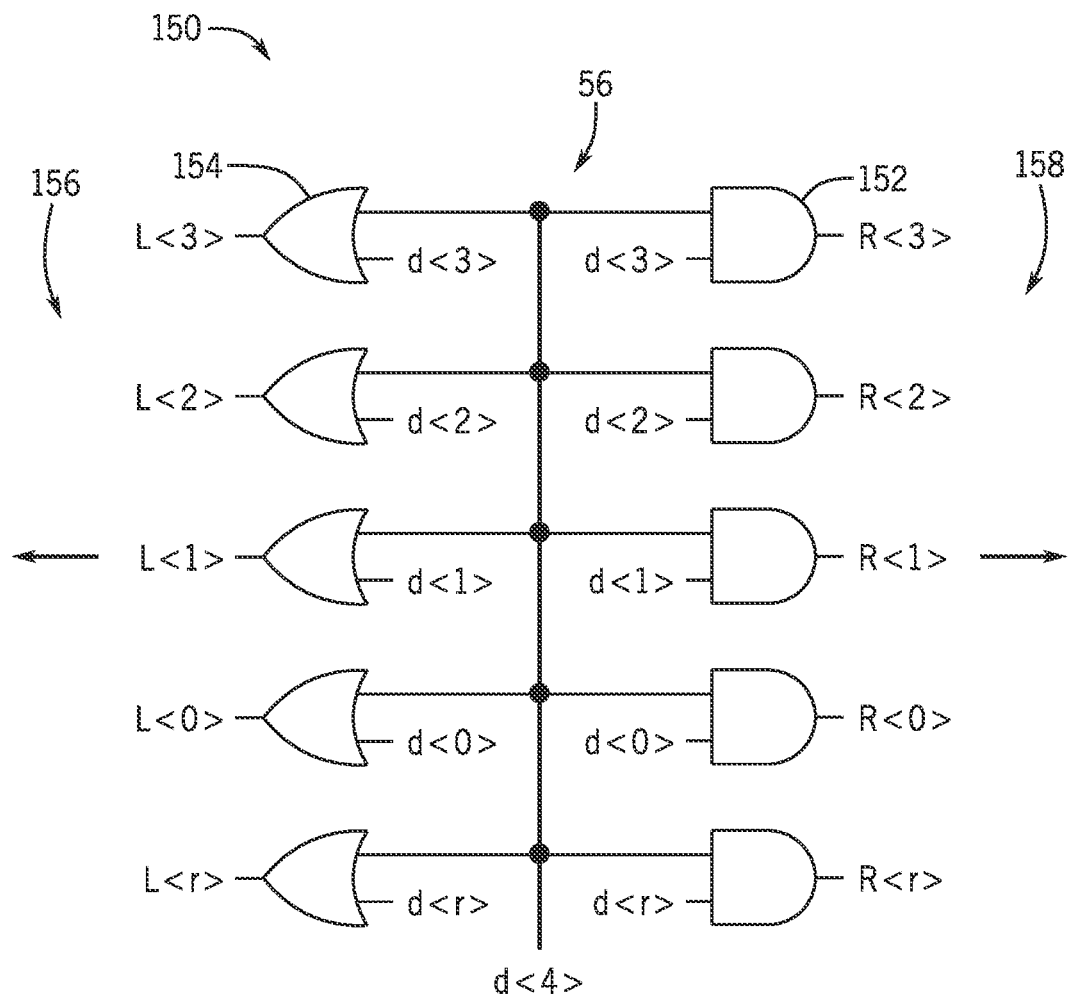
FIG. 11 is example logic of the decision unit of FIG. 7 that includes AND gates and OR gates, in accordance with an embodiment of the present disclosure.

As discussed above, the decision units 106 may output different portions of the digital signal 56 in different directions (e.g., left and right) down the branching data path of the fractal DAC 100. In some embodiments, the particular portions of the digital signal 56 and/or the directions of each of the outputs of the decision units 106 may be organized to set the fill order 140. For example, FIG. 11 is example DU logic 150 of a decision unit 106 (e.g., as discussed above) that includes AND gates 152 and OR gates 154, according to an embodiment of the present disclosure. If implemented at each decision unit level, the DU logic 150 may set the fill order 140 to fill unit cells 102 on the left branch 156 of the decision unit 106 before the right branch 158, as in the fill order 140 of FIG. 10. As used herein, "left" and "right" are used to help differentiate branches of the data path output from a decision unit 106 and, as should be appreciated, are not meant in a limiting fashion. That is, the DU logic 150 may also be implemented in the reverse to fill the right branch 158 before the left branch 156. Moreover, different decision unit levels may be implemented with DU logic 150 that prioritize different branches such that the fill order 140 is directed to begin at a desired location within the unit cell array 142. As discussed above, a fill order 140 that begins on one side of the unit cell array 142 and includes physically adjacent sequential activations may increase linearity. However, filling from different sides of the unit cell array 142, spatially or temporally, may assist in balancing the gain gradient of the output grid 130, further increasing the linearity of the fractal DAC 100.

Figure 12:
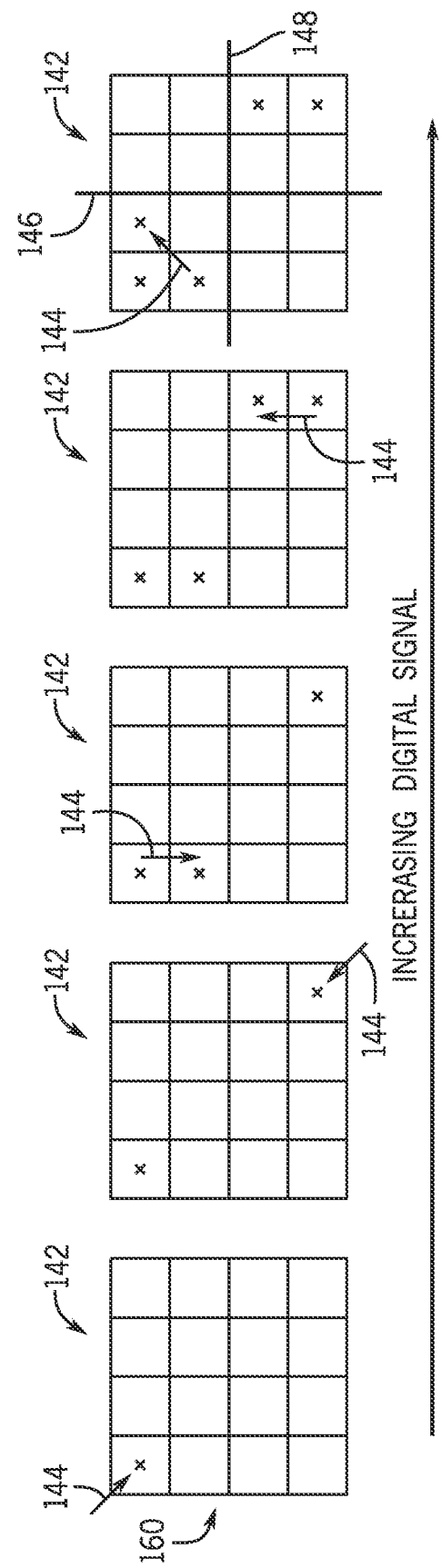
FIG. 12 is an example static alternating fill order (AFO) of sequentially increasing activations of unit cells of a unit cell array, in accordance with an embodiment of the present disclosure.

In some embodiments, to help counter the gain gradient of the outputs of the unit cells 102, an alternating fill order (AFO) may be set such that the unit cell array 142 may be filled in multiple different ways. For example, the unit cell array 142 may be filled according to a static AFO 160 that spatially fills the unit cell array 142 from multiple sides, as shown in FIG. 12. Additionally or alternatively, as discussed further below, a dynamic AFO may spatially fill from a single side of the unit cell array 142, but alternate where the AFO starts filling temporally. In some embodiments, the static AFO 160 fills from opposite sides of the unit cell array 142, as shown by the fill arrows 144. By filling from opposite sides, error associated with the gain gradient of the unit cells 102 may be balanced, which may effectively negate such error. For example, for a tap point 132 in the center of the unit cell array 142 or at the midpoint of a side the unit cell array 142, such as in FIG. 9, the static AFO 160 may provide symmetry and balance across the vertical axis 146 and the horizontal axis 148. Such balancing of the gain gradients across one or more axes may be referred to as "folding" about the corresponding one or more axes.

Figure 13:
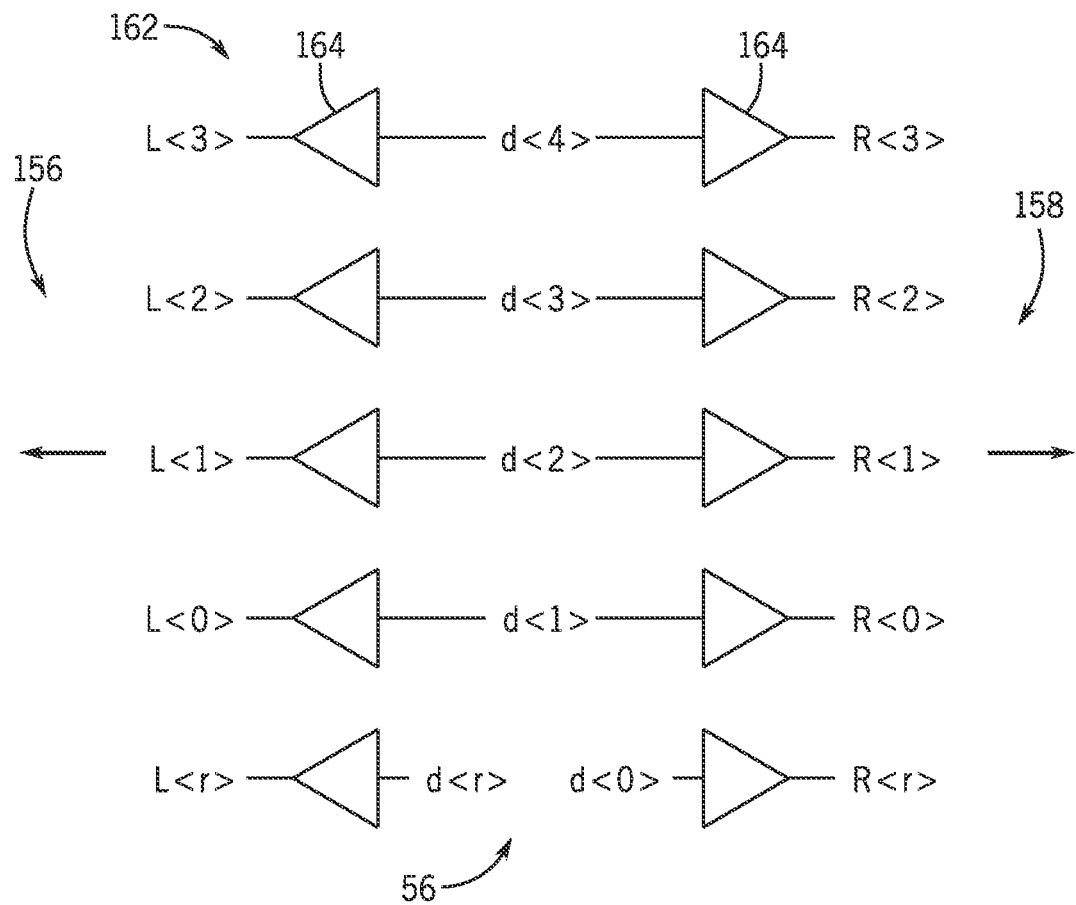
FIG. 13 is example static AFO logic that includes one or more buffers that output respective portions of a digital signal, in accordance with an embodiment of the present disclosure.

As discussed above, different decision units 106 may be implemented to fulfill a particular fill order. For example, FIG. 13 is example static AFO logic 162 that includes one or more buffers 164 to propagate respective portions of the digital signal 56 down the left branch 156 and the right branch 158, according to an embodiment of the present disclosure. For example, a static AFO decision unit 106 may pass through a subset of the bits (e.g., one or more MSBs) of the digital signal 56, while sending other bits (e.g., d<0> and d<r>, also known as the remainder) to solely the right branch 158 or the left branch 156. In other words, the bit-depth of the digital signal 56 may be decreased by outputting respective subsets of the bits of the digital signal 56 to respective output branches (e.g., the right branch 158 and the left branch 156) of the static AFO logic 162. As should be appreciated, the decoding (e.g., bit-wise partitioning) of the digital signal 56 using the static AFO logic 162, as discussed herein, is given as an example, and other logic components may be added, substituted, or rearranged to achieve an alternating fill order.

Figure 14:
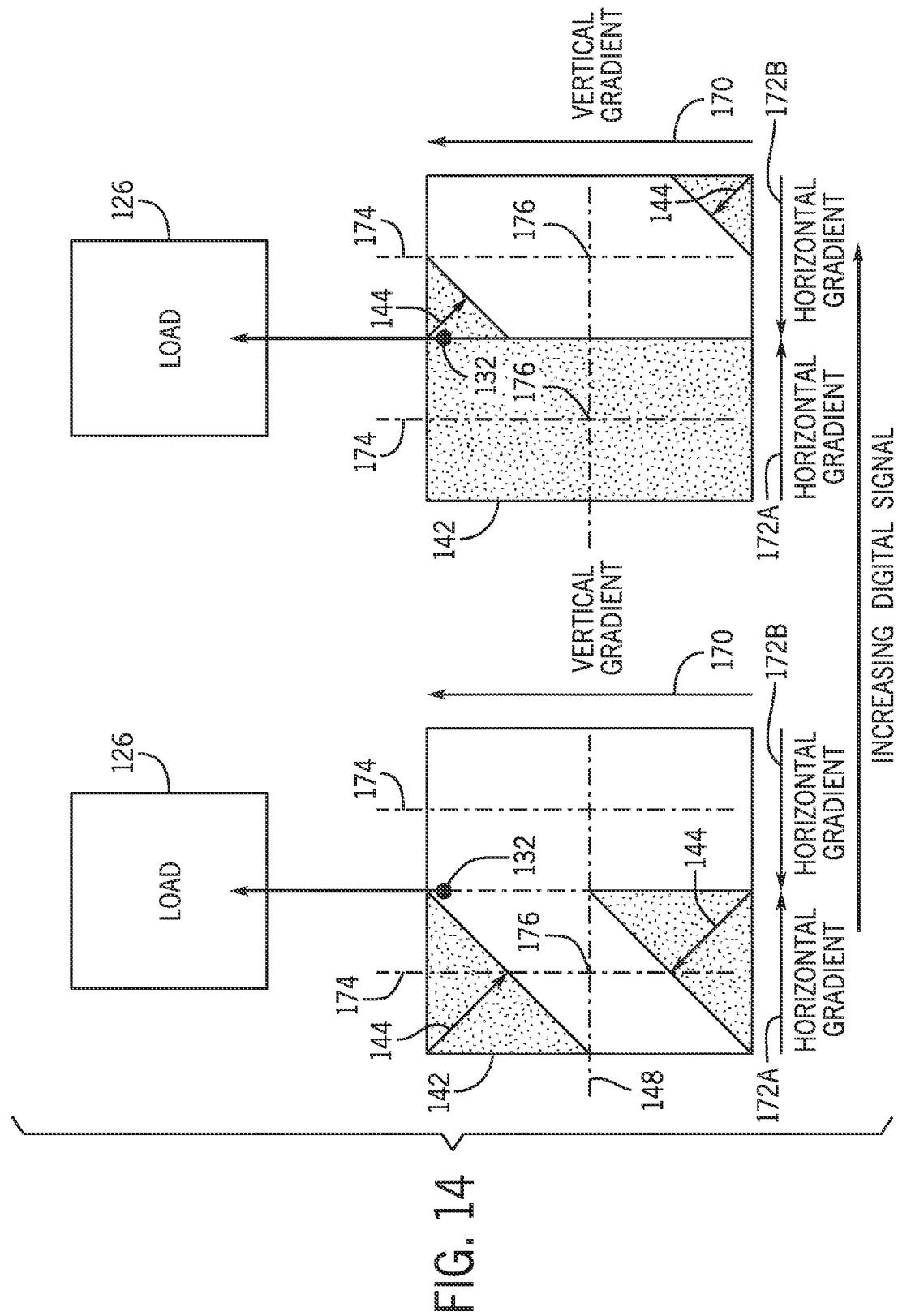
FIG. 14 is a unit cell array illustrated at two different amounts of unit cell activation (e.g., fill) using static AFO logic of FIG. 13, in accordance with an embodiment of the present disclosure.

Additionally, in some embodiments, the static AFO logic 162 may be implemented for one or more levels of decision units 106 while DU logic 150 is implemented at other levels of decision unit 106. For example, with respect to the static AFO 160 of FIG. 12, the static AFO logic 162 is implemented at the first level of decision unit (e.g., decision unit 106A), and the DU logic 150 is implemented at other levels of decision units 106. As should be appreciated, any decision unit logic (e.g., static AFO logic 162, DU logic 150, or other decision unit logic) may be utilized at any decision unit level, depending on implementation, to provide an AFO (e.g., static AFO 160 or dynamic AFO, as discussed below) that balances the gain gradient spatially and/or temporally. For example, different locations of tap points 132 may cause different gain gradients across the unit cell array 142, which may be balanced by AFOs that are implemented at different decision unit levels. Moreover, multiple different static AFOs 160 may be utilized for the same tap point location. For example, FIG. 14 is a unit cell array 142 illustrated at two different amounts of unit cell activation (e.g., fill) with static AFO logic implemented at the second decision unit level (e.g., for decision units 106B), according to an embodiment of the present disclosure. Because the tap point 132 is located in the middle of the top side (e.g., relative to FIG. 14) of the unit cell array 142, the vertical gradient 170 is in a single direction and the horizontal gradients 172A and 172B (cumulatively 172) are in two opposite directions, progressing toward the tap point 132. As with the static AFO 160 of FIG. 12, the static AFO 160 depicted in FIG. 14 also folds along the horizontal axis 148, providing balance to the vertical gradient 170. However, as the static AFO 160 of FIG. 14 is implemented at the second decision unit level (e.g., at decision units 106B) a double-fold is implemented across two symmetrically offset vertical axes 174. In other words, the unit cell array 142 may be divided into portions (e.g., a left portion and a right portion) that are filled sequentially, while each portion is filled by alternating unit cell activations between sub-portions (e.g., a top sub-portion and a bottom sub-portion) of the respective portions of the unit cell array 142. For each fold, a geometric mean 176 is produced within the gain gradient. However, as the geometric means 176 are centered with respect to the vertical gradient 170 and each of the horizontal gradients 172, symmetry and balance of the gain gradients is maintained.

Figure 15:
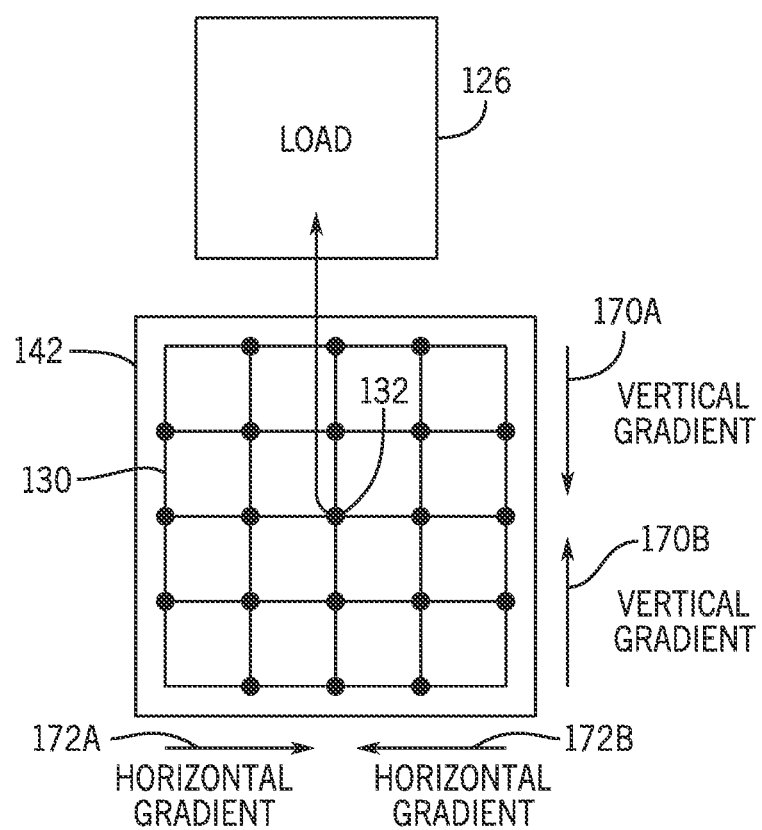
FIG. 15 is an example of an output grid and unit cell array with a centered tap point generating a two vertical gradients and two horizontal gradients and, in accordance with an embodiment of the present disclosure.

Extending further, FIG. 15 is an example of an output grid 130 and unit cell array 142 with a centered tap point 132 generating a two vertical gradients 170A and 170B (cumulatively 170) and two horizontal gradients 172A and 172B, according to an embodiment of the present disclosure. While the previously discussed static AFOs 160 may still provide adequate folding (e.g., adequate balance of the gain gradients 170 and/or 172), in some embodiments, the static AFO logic 162 may be implemented at the third decision unit level (e.g., at decision unit 106C) to provide double folds in both the horizontal and vertical directions. Double folding in one or more directions may be of additional benefit in fractal DACs 100 that utilize multiple phases such as quadrature components (e.g., I-phase, Q-phase, negative I-phase, and/or negative Q-phase). For example, in some embodiments, the number of phases may be equal to or a factor of the number of folds, such that each phase may have a fill order that operates in a different (e.g., opposite relative to the vertical axis 146 and/or horizontal axis 148) direction.

As discussed above, the static AFO 160 may provide increased linearity by geometrically (e.g., spatially) balancing the gain gradients of the unit cell array 142. Such balancing may result in noise that is distributed in the frequency spectrum to increase the SNR. Additionally or alternatively to the static AFO 160, a dynamic AFO may be implemented to temporally balance the gain gradients of the unit cell array 142.

Figure 16:
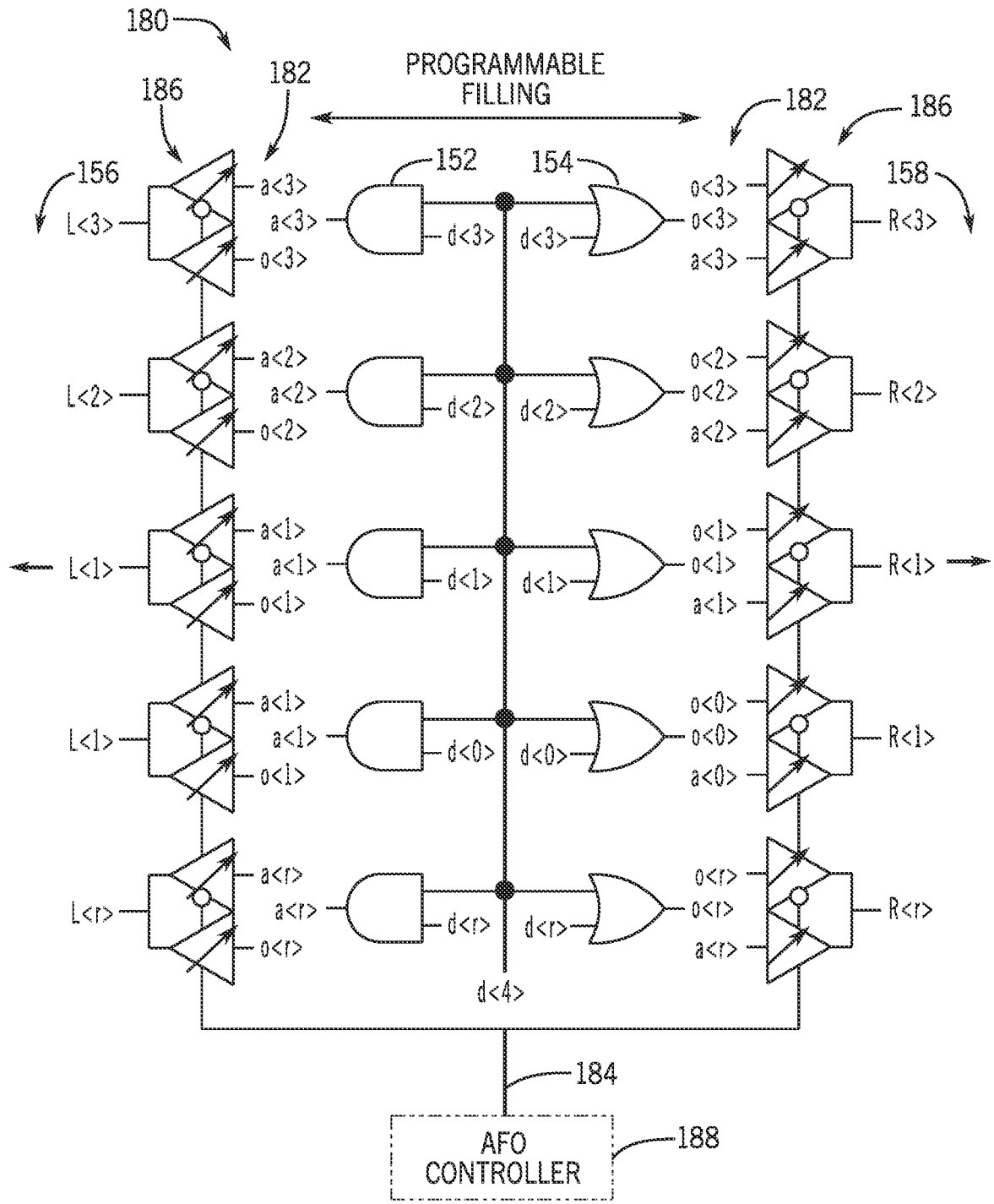
FIG. 16 is example dynamic AFO logic having programmable logic states that may change over time (e.g., on different cycles) according to a dynamic AFO program, in accordance with an embodiment of the present disclosure.

FIG. 16 is example dynamic AFO logic 180 having programmable logic states 182 that may change over time (e.g., on different cycles) according to a dynamic AFO program 184, according to an embodiment of the present disclosure. As illustrated, the dynamic AFO logic 180 may include AND gates 152 and/or OR gates 154 similar to the DU logic 150. Additionally, the dynamic AFO logic 180 may include multi-state logic 186 to select between the programmable logic states 182 according to the dynamic AFO program 184. For example, the dynamic AFO logic 180 may have two programmable logic states 182: a first logic state that fills from the left branch 156 first (e.g., as depicted by the fill order 140 of FIG. 10); and a second logic state that fills from the right branch 158 first (e.g., the opposite of the fill order of FIG. 10). Moreover, in some embodiments, the programmable logic state 182 and, thus, the fill order utilized at a particular time (e.g., cycle) may be selected by the dynamic AFO program 184. For example, the dynamic AFO program 184 may include a patterned single bit that alternates on subsequent cycles (e.g., 010101, 00110011, 000111000111, etc.). Additionally or alternatively, the dynamic AFO program 184 may be provided via an AFO controller 188, which may include a counter, a processor, memory, and/or any suitable logic to generate the dynamic AFO program 184. Furthermore, the AFO controller 188 may be implemented as stand-alone circuitry or implemented via one or more other controllers or processors (e.g., processor 12) of the electronic device 10.

Figure 17:
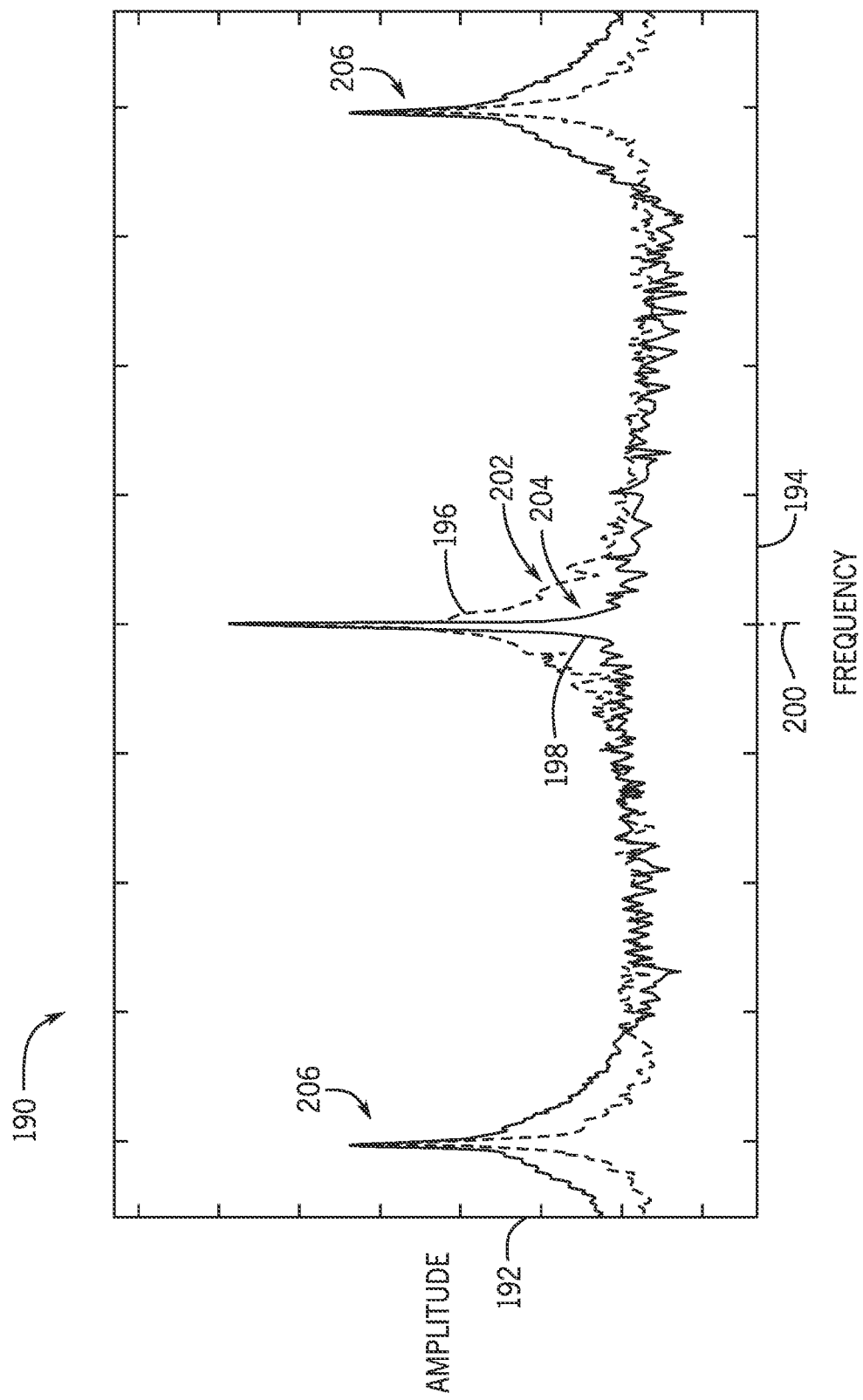
FIG. 17 is a graph of amplitude vs. frequency of a non-AFO analog output signal and a dynamic AFO analog output signal centered at a frequency of operation of the fractal DAC of FIG. 6, in accordance with an embodiment of the present disclosure.

In a similar manner to how the static AFO 160 generated a geometric mean 176 that balanced the gain gradients spatially, the dynamic AFO program 184 may alternate the fill order of the AFO logic 180 between the programmable logic states 182 such that the gain gradients may be balanced temporally (e.g., averaged over multiple cycles). However, while the static AFO 160 generally disperses the noise associated with the gain gradients, utilizing a dynamic AFO relocates the noise to other frequencies. For example, FIG. 17 is a graph 190 of amplitude 192 vs. frequency 194 of a non-AFO analog output signal 196 and a dynamic AFO analog output signal 198 centered at a frequency of operation 200 of the fractal DAC 100, according to an embodiment of the present disclosure. As should be appreciated, the frequency of operation 200 of the fractal DAC 100 may refer to the rate of digital-to-analog conversions (e.g., in cycles per second), which may be set at or vary between any suitable frequency (e.g., less than 1 GHz, between 1 GHz and 5 GHz, between 1 GHz and 10 GHz, greater than 1 GHz, greater than 3 GHz, greater than 5 GHz, greater than 10 GHz, and so on) depending on implementation. For example, the frequency may be selected to provide a radio frequency (RF) signal (e.g., via modulating a carrier wave) to be transmitted (e.g., via one or more antennas 34).

The non-AFO analog output signal 196 may include noise 202 around the frequency of operation 200 due to the gain gradients. However, the dynamic AFO analog output signal 198 may have reduced noise 204 around the frequency of operation 200 by shifting the noise to other frequencies 206. In some scenarios, certain frequencies, even if not the frequency of operation 200, may be undesirable for noise, such as carrier frequencies. As such, in some embodiments, to where the noise is shifted may be selectable based on the dynamic AFO program 184. For example, an immediately alternating dynamic AFO program 184 (e.g., 010101) may shift the noise to the half-rate frequencies of the frequency of operation 200. Additionally, a doubled alternating dynamic AFO program 184 (e.g., 00110011) may shift the noise to quarter-rate frequencies, and a triple alternating dynamic AFO program 184 (e.g., 000111000111) may shift the noise to one-sixth rate frequencies. Further, in some embodiments, the dynamic AFO program 184 may include some temporal dithering to further disperse noise and/or achieve different placements of the other frequencies 206 to which the noise is shifted. For example, temporally dithering bits of the triple alternating dynamic AFO program 184 may shift the noise to one-third rate frequencies.

As should be appreciated, any suitable dynamic AFO program 184 may be utilized to shape the noise profile as desired. Furthermore, as with the static AFO 160, the dynamic AFO may be implemented at any suitable decision unit level. In some embodiments, the dynamic AFO logic 180 may be implemented with the static AFO logic 162, at different decision unit levels to balance the gain gradients both spatially and temporally.

Figure 18:
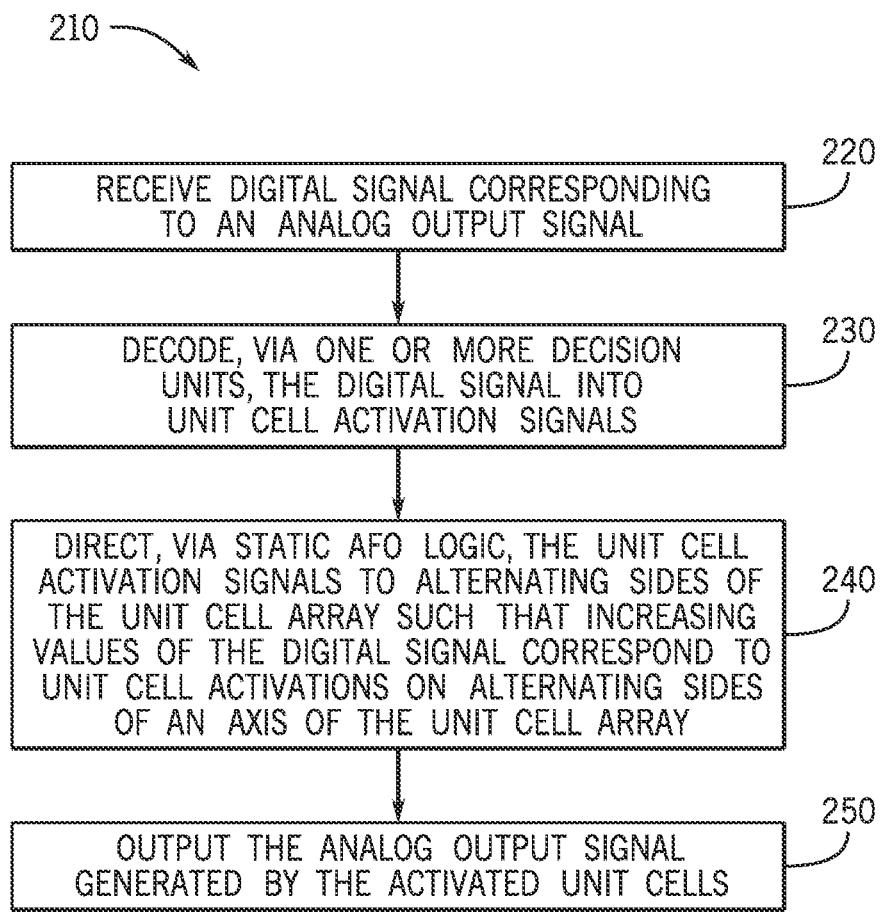
FIG. 18 is a flowchart of an example process for implementing a static AFO within the fractal DAC of FIG. 6, in accordance with an embodiment of the present disclosure.

FIG. 18 is a flowchart 210 of an example process for implementing a static AFO 160 within a fractal DAC 100, according to an embodiment of the present disclosure. The digital signal 56, corresponding to an analog output signal 64, may be received by the fractal DAC 100 (process block 220). Additionally, one or more decision units 106 of the fractal DAC 100 may decode the digital signal 56 into unit cell activation signals (e.g., thermometric activation signals) (process block 230). Furthermore, in some embodiments, at least one of the decision units 106 may include static AFO logic 162 that directs, at least in part, the unit cell activation signals (whether decoded yet or not) to alternating sides of the unit cell array 142, such that increasing values of the digital signal 56 correspond to unit cell activations on alternating sides of an axis of the unit cell array 142 (process block 240). The analog output signal 64 generated by the activated unit cells 102 (e.g., in the aggregate) may then be output (process block 250).

Figure 19:
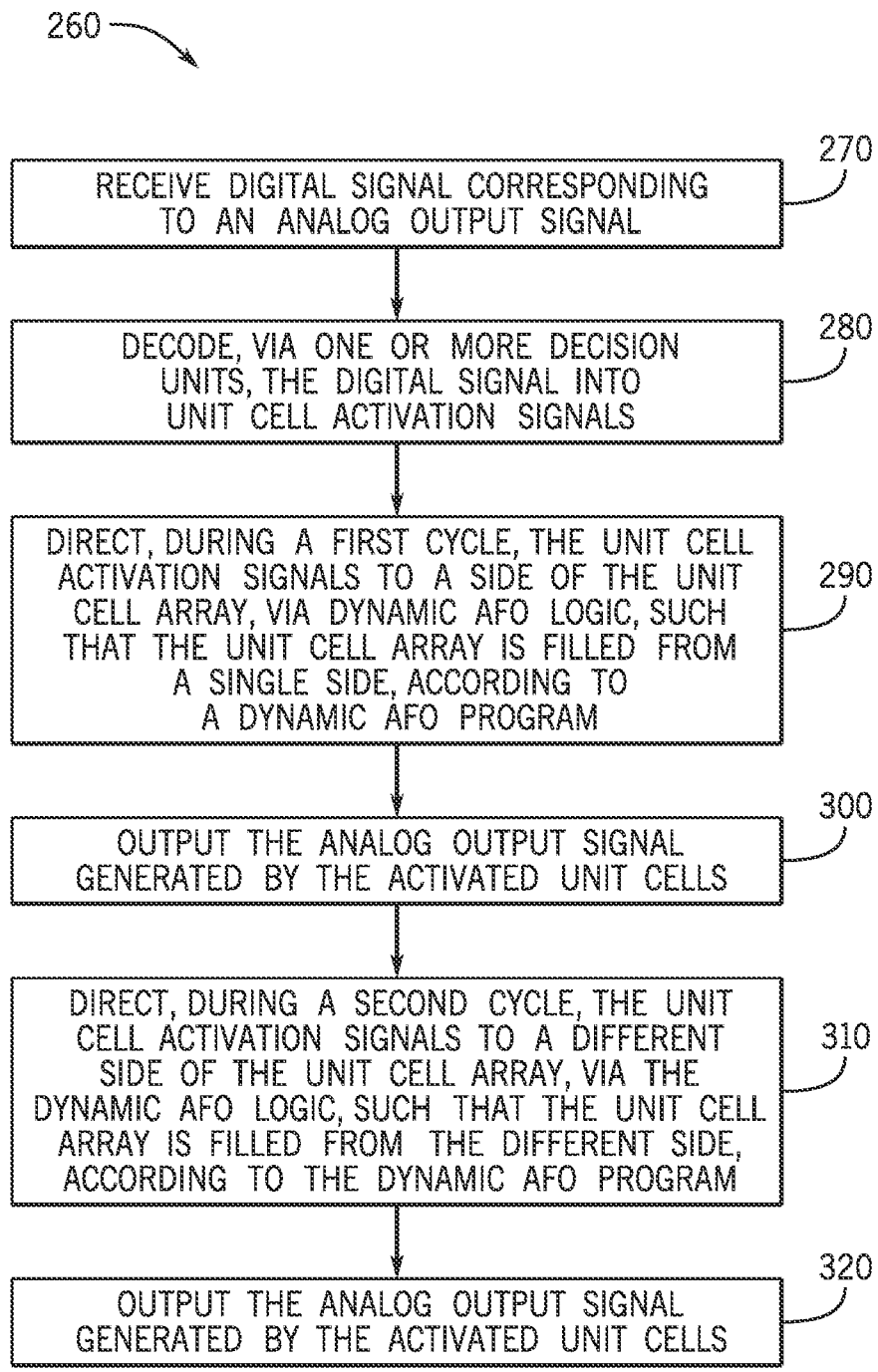
FIG. 19 is a flowchart of an example process for implementing a dynamic AFO within the fractal DAC of FIG. 6, in accordance with an embodiment of the present disclosure.

FIG. 19 is a flowchart 260 of an example process for implementing a dynamic AFO within a fractal DAC 100, according to an embodiment of the present disclosure. The digital signal 56, corresponding to an analog output signal 64, may be received by the fractal DAC 100 (process block 270), and one or more decision units 106 of the fractal DAC 100 may decode the digital signal 56 into unit cell activation signals (e.g., thermometric activation signals) (process block 280). Additionally, one or more decision units 106 may include dynamic AFO logic 180 that directs the unit cell activation signals to a side of the unit cell array 142, via dynamic AFO logic 180, such that the unit cell array is filled from a single side, according to a dynamic AFO program (process block 290). As should be appreciated, although stated as being filled from a single side, in the case of multiple folds, the unit cell array 142 may be filled from multiple sides while utilizing the dynamic AFO logic 180. As such, the single side may refer to a single side of a particular fold. The analog output signal 64 generated by the activated unit cells 102 (e.g., in the aggregate) may then be output (process block 300). In a second (e.g., subsequent) cycle, the unit cell activation signals may be directed, via the dynamic AFO logic 180, to a different side of the unit cell array 142, such that the unit cell array 142 is filled from the different side, according to the dynamic AFO program (process block 310). As should be appreciated, the different side may refer to the different side of the corresponding fold from process block 290. Moreover, in some embodiments, the temporal average of the when the unit cell array 142 (or a fold thereof) is filled from either side may be balanced. The analog output signal 64 generated by the activated unit cells 102 (e.g., in the aggregate) may then be output (process block 320).

As discussed above, by providing one or more techniques AFO (e.g., a static AFO 160, a dynamic AFO, or a combination thereof), the fractal DAC 100 may operate with increased symmetry (e.g., spatially and/or temporally) to reduce noise and/or increase linearity. Additionally, while discussed above in regard to the unit cell array 142 of a fractal DAC 100, as should be appreciated, the AFO techniques described herein may also be applicable to other DACs such as the column and line DAC 114 and DACs 40 that utilize binary unit cells. In other words, control signals 116 may be generated by the control logic 118 and/or additional logic to implement a static (e.g., spatial) and/or dynamic (e.g., temporal) AFO to fold the noise associated with gain gradients. For example, whereas a column and line DAC 114 would normally fill one column after the other, an AFO for a column and line DAC 114 may fill multiple columns at once to equalize (e.g., in the average) the distance to the tap point 132.

Moreover, as discussed above, some unit cells 102 may operate using binary instead of thermometric coding, for example, to increase the resolution of the fractal DAC 100. The dynamic AFO logic 180 and/or the static AFO logic 162 may be utilized at one or more decision units 106 in conjunction with binary unit cells by arranging the binary unit cells to be symmetrical across whichever axes folding is to occur. For example, the binary unit cells may be implemented independently (e.g., without replacing a thermometric unit cell 102) or as a replacement to a thermometric unit cell 102, if symmetrically is maintained, such as to maintain balance (e.g., noise folding) according to the fill order. Moreover, in some embodiments, when using binary unit cells in conjunction with an AFO, the binary unit cells may include their own branch along the branching data path that is maintained before and after the binary portion of the digital signal 56 is extricated so as to maintain symmetry along the branching data path. Furthermore, although the above referenced flowcharts 210 and 260 are shown in a given order, in certain embodiments, process blocks may be reordered, altered, deleted, and/or occur simultaneously. Additionally, the referenced flowcharts are given as illustrative tool and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A digital-to-analog converter (DAC) comprising:
a unit cell array comprising a plurality of unit cells;
a branching data path coupled to the plurality of unit cells; and
static alternating fill order (AFO) logic disposed at a branch point on the branching data path and comprising a plurality of buffers configured to receive a digital signal and output a first portion of the digital signal onto a first branch of the branching data path and a second portion of the digital signal onto a second branch of the branching data path, the first portion of the digital signal and the second portion of the digital signal having a reduced bit depth relative to the digital signal.

2. The DAC of claim 1, wherein the first branch directs the first portion of the digital signal to a first set of unit cells of the plurality of unit cells and the second branch directs the second portion of the digital signal to a second set of unit cells of the plurality of unit cells, the first set of unit cells being disposed on an opposite side of the unit cell array relative to the second set of unit cells about an axis of the unit cell array.

3. The DAC of claim 2, wherein the static AFO logic is configured to direct the first portion of the digital signal onto the first branch and the second portion of the digital signal onto the second branch such that sequentially increasing values of the digital signal correspond to increasing unit cell activations that alternate between the first set of unit cells and the second set of unit cells.

4. The DAC of claim 1, wherein the static AFO logic is configured to decode, at least partially, the digital signal, the first portion of the digital signal and the second portion of the digital signal being partially decoded portions of the digital signal, and wherein the branching data path is configured to communicate decoded portions of the digital signal to corresponding unit cells of the plurality of unit cells.

5. The DAC of claim 1, wherein the first portion of the digital signal comprises a remainder bit of the digital signal and a plurality of other bits of the digital signal, and wherein the second portion of the digital signal comprises the plurality of other bits and does not include the remainder bit.

6. An electronic device comprising:
a digital-to-analog converter (DAC) comprising
a plurality of cells disposed in a unit cell array,
a data path configured to communicate a digital signal, corresponding to an analog output of the DAC, to the plurality of cells, and
static alternating fill order (AFO) logic configured to set a fill order of the unit cell array that alternates unit cell activations for sequentially increasing values of the digital signal between opposing sides of the unit cell array relative to at least one axis of the unit cell array; and
a load configured to receive the analog output of the DAC.

7. The electronic device of claim 6, comprising a plurality of decision units disposed at a plurality of decision unit levels on the data path and configured to decode the digital signal to generate decoded portions of the digital signal, the plurality of cells configured to operate based at least in part on the decoded portions of the digital signal, wherein a first decision unit of the plurality of decision units, disposed at a first decision unit level of the plurality of decision unit levels, comprises the static AFO logic.

8. The electronic device of claim 7, wherein the static AFO logic is configured to output a first portion of the digital signal and a second portion of the digital signal to respective branches of a plurality of different branches of the data path according to the fill order, the first portion of the digital signal and the second portion of the digital signal comprising at least partially decoded portions of the digital signal.

9. The electronic device of claim 8, wherein the data path comprises a branching distribution tree disposed in a fractal layout and configured to distribute the decoded portions of the digital signal to the plurality of cells, wherein the branching distribution tree comprises the plurality of different branches.

10. The electronic device of claim 7, wherein a second decision unit of the plurality of decision units is disposed at the first decision unit level and comprises second static AFO logic, and wherein a third decision unit of the plurality of decision units is disposed at a second decision unit level and configured to receive the digital signal and generate a first branch of the data path and a second branch of the data path, the first decision unit being disposed on the first branch and the second decision unit being disposed on the second branch.

11. The electronic device of claim 10, wherein the static AFO logic and the second static AFO logic set the fill order such that the unit cell activations for the sequentially increasing values of the digital signal fill a first portion of the unit cell array before a second portion of the unit cell array, wherein filling the first portion comprises alternating the unit cell activations for the sequentially increasing values of the digital signal alternate between a first sub-portion of the first portion of the unit cell array and a second sub-portion of the first portion of the unit cell array, the first sub-portion and second sub-portion being on opposite sides of the first portion.

12. The electronic device of claim 6, wherein the DAC comprises an output grid coupled to the unit cell array and configured to output an analog signal corresponding to the digital signal, the output grid comprising a tap point operatively coupled to the load, wherein each cell of the plurality of cells is associated with a gain error based at least in part on its respective proximity to the tap point of the output grid, and wherein the static AFO logic is configured to set the fill order such that a geometric mean of the gain error of each of the plurality of cells is balanced.

13. The electronic device of claim 12, wherein each cell of the plurality of cells is configured to enable or disable based at least in part on a received decoded portion of the digital signal, wherein enabled cells of the plurality of cells are configured to generate respective portions of the analog output, the output grid being configured to aggregate the respective portions to form the analog output.

14. The electronic device of claim 6, wherein the load comprises an impedance matching network.

15. The electronic device of claim 6, wherein the static AFO logic comprises a plurality of buffers configured to receive a set of bits of the digital signal and output different subsets of the set of bits down different branches of the data path.

16. A method comprising:
receiving, at a digital-to-analog converter (DAC), a digital signal corresponding to an analog output signal of the DAC, the DAC comprising a plurality of cells disposed in a unit cell array and configured to generate the analog output signal;
generating, via static alternating fill order (AFO) logic, a first partially decoded portion of the digital signal and a second partially decoded portion of the digital signal based at least in part on the digital signal; and
directing, via the static AFO logic, the first partially decoded portion of the digital signal along a first data path to a first set of cells of the plurality of cells and the second partially decoded portion of the digital signal along a second data path to a second set of cells of the plurality of cells such that a fill order of the unit cell array alternates between the first set of cells and the second set of cells.

17. The method of claim 16, wherein the first set of cells and the second set of cells are disposed on opposite sides the unit cell array with respect to one or more axes of the unit cell array.

18. The method of claim 17, wherein the one or more axes of the unit cell array comprise axes of symmetry about a gain gradient associated with the plurality of cells.

19. The method of claim 18, wherein the DAC comprises an output grid coupled to outputs of the plurality of cells and configured to aggregate individual outputs of the plurality of cells to generate the analog output signal, wherein the gain gradient comprises higher gains at unit cell locations closer to a tap point of the output grid than unit cell locations further from the tap point.

20. The method of claim 16, wherein the first data path and the second data path are portions of a branching data path disposed in a fractal pattern.

* * * * *